United States Patent
Seidl et al.

(10) Patent No.: US 7,186,607 B2
(45) Date of Patent: Mar. 6, 2007

(54) CHARGE-TRAPPING MEMORY DEVICE AND METHOD FOR PRODUCTION

(75) Inventors: Harald Seidl, Poering (DE); Josef Willer, Riemerling (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/061,314

(22) Filed: Feb. 18, 2005

(65) Prior Publication Data

US 2006/0186480 A1    Aug. 24, 2006

(51) Int. Cl.
*H01L 21/8238* (2006.01)

(52) U.S. Cl. ............... 438/200; 438/657; 257/E21.205

(58) Field of Classification Search ............... 438/200, 438/657; 257/E21.205, E21.423
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,548,881 B1 | 4/2003 | Blish et al. | |
| 6,570,211 B1 | 5/2003 | He et al. | |
| 6,580,120 B2 | 6/2003 | Haspeslagh | |
| 6,697,280 B2 | 2/2004 | Natori | |
| 6,743,674 B2 | 6/2004 | Wang | |
| 6,803,620 B2 | 10/2004 | Moriya et al. | |
| 6,806,517 B2* | 10/2004 | Kim et al. | 257/204 |
| 2002/0079533 A1 | 6/2002 | Horiguchi et al. | |
| 2002/0132430 A1 | 9/2002 | Willer et al. | |
| 2003/0015752 A1* | 1/2003 | Palm et al. | 257/315 |
| 2003/0160280 A1 | 8/2003 | Yoshino | |
| 2003/0185055 A1 | 10/2003 | Yeh et al. | |
| 2003/0230783 A1 | 12/2003 | Willer et al. | |
| 2004/0014280 A1 | 1/2004 | Willer et al. | |
| 2005/0196922 A1 | 9/2005 | Willer | |

OTHER PUBLICATIONS

Johnson, F.S., et al., "Selective Chemical Etching of Polycrystalline SiGe Alloys with Respect to Si and Sio$_2$," Electron. Mater., vol. 21, No. 8, pp. 805-810, 1992.

Yeh, C.C., et al., "PHINES: A Novel Low Power Program/Erase, Small Pitch, 2-Bit per Cell Flash Memory," 2002 IEEE, 4 pages.

Franke A.E., et al., "Polycrystalline Silicon-Germanium Films for Integrated Microsystems," Journal of Microelectromechanical Systems, vol. 12, No. 2, Apr. 2003, pp. 160-171.

Lee, S-Y., et al., "A Novel Multibridge-Channel MOSFET (MBCFET): Fabrication Technologies and Characteristics," IEEE Transactions on Nanotechnology, vol. 2, No. 4, Dec. 2003, pp. 253-257.

* cited by examiner

*Primary Examiner*—Chandra Chaudhari
(74) *Attorney, Agent, or Firm*—Slater & Matsil, L.L.P.

(57) ABSTRACT

A thin SiGe layer is provided as an additional lower gate electrode layer and is arranged between a thin gate oxide and a gate electrode layer, preferably of polysilicon. The SiGe layer can be etched selectively to the gate electrode and the gate oxide and is laterally removed adjacent the source/drain regions in order to form recesses, which are subsequently filled with a material that is appropriate for charge-trapping. The device structure and production method are appropriate for an integration scheme comprising local interconnects of memory cells, a CMOS logic periphery and means to compensate differences of the layer levels in the array and the periphery.

16 Claims, 6 Drawing Sheets

CHARGE-TRAPPING MEMORY DEVICE AND METHOD FOR PRODUCTION

CROSS-REFERENCE TO RELATED APPLICATION

This application is related to the co-pending and commonly assigned patent application Ser. No. 10/795,611, filed Mar. 8, 2004, entitled, Method for Producing Semiconductor Memory Devices and Integrated Memory Device, which application is hereby incorporated herein by reference.

TECHNICAL FIELD

This invention relates to a method for producing charge-trapping memory cells intended for multi-bit storage and further relates to a particular memory cell structure that is produced by this method.

BACKGROUND

The memory cells and their structural features are submitted to a steady process of diminution in order to reduce the area of the cell array and to achieve an ever-growing storage density. This development is to some degree adverse to the requirements of the complementary transistors forming the addressing logic circuits arranged in the periphery of the memory cell array and usually produced in standard CMOS technology, which renders devices of larger dimensions. It is a heretofore unresolved problem how memory cells comprising transistor structures on a scale of typically 70 nm, especially charge-trapping memory cells, can be integrated with CMOS devices of much larger dimensions on the same semiconductor substrate by a process that does not deviate significantly from standard manufacturing processes.

Memory devices with charge-trapping layers, especially SONOS memory cells comprising oxide-nitride-oxide layer sequences as storage medium, are usually programmed by channel hot electron injection. U.S. Pat. No. 5,768,192 and U.S. Pat. No. 6,011,725, which are incorporated herein by reference, disclose charge-trapping memory cells of a special type of so-called NROM cells, which can be used to store bits of information both at the source and at the drain below the respective gate edges. The programmed cell is read in reverse mode to achieve a sufficient two-bit separation. Erasure is performed by hot hole injection.

U.S. Patent Application Publication 2003/0185055 A1 and a corresponding paper of C. C. Yeh et al., "PHINES: A Novel Low Power Program/Erase, Small Pitch, 2-Bit per Cell Flash Memory", 2002 IEEE, which are incorporated herein by reference, disclose a non-volatile semiconductor memory cell with electron-trapping erase state, which is operated as flash memory and is able to store two bits. The erasure takes place by Fowler-Nordheim tunneling of electrons from either channel or gate electrode into the storage layer of a conventional charge-trapping layer sequence, for example an ONO layer sequence. In programming this memory, electric holes are injected into the non-conducting charge-trapping layer. Hot hole injection can be induced at source and drain, which means, at both ends of the channel.

The memory layer can be substituted with another dielectric material, provided the energy band gap is smaller than the energy band gap of the confinement layers. The difference in the energy band gaps should be as great as possible to secure a good charge carrier confinement and thus good data retention. Especially when silicon dioxide is used as confinement layers, the memory layer can be tantalum oxide, hafnium silicate, cadmium silicate, titanium oxide, zirconium oxide, aluminum oxide, or intrinsically conducting (non-doped) silicon. The memory layer can also comprise electrically insulating or conducting nano dots, which are small particles having diameters of a few nanometers and are located in a layer of dielectric material.

SUMMARY OF THE INVENTION

In one aspect, the present invention provides an improved charge-trapping memory device for better multi-bit-storage in each memory cell.

In a further aspect, this invention provides a method of producing this memory device having a memory cell array structure which is appropriate for integration with CMOS electronic circuits.

In still a further aspect, the invention provides an integration scheme for an array of multi-bit charge-trapping memory cells with an addressing periphery.

The preferred embodiment inventive method applies a thin SiGe layer, which is provided as an additional lower gate electrode layer and which is arranged between a thin gate oxide and a gate electrode layer, preferably of polysilicon. The SiGe layer is laterally removed adjacent to the source/drain regions in order to form recesses that are subsequently filled with a material, which is appropriate for charge-trapping. SiGe is especially advantageous, because it can be etched selectively to the gate electrode and the gate oxide. Furthermore, the additional SiGe gate electrode modifies the threshold voltage of the memory cell favorably.

The semiconductor memory device according to this invention comprises a semiconductor body and an array of memory cells. Every memory cell has a channel region between source/drain regions at a main surface of the semiconductor body, a gate electrode with sidewalls adjacent to the source/drain regions above the channel region and separated from the channel region by a gate oxide, and an SiGe layer between the gate oxide and the gate electrode layer, the SiGe layer being laterally recessed under the gate electrode layer adjacent the source/drain regions. Memory layers of a material that is suitable for charge-trapping are arranged between the gate electrode layer and the source/drain regions on both sides of the SiGe layer and are surrounded by a dielectric material. Sidewall spacers of electrically insulating material are arranged on the sidewalls of the gate electrode.

The method for fabricating this semiconductor memory device comprises forming a gate oxide on a surface of a semiconductor body and depositing an SiGe layer, a gate electrode layer and a wordline layer on the gate oxide. The wordline layer, the gate electrode layer and the SiGe layer are structured to form wordline stacks and residual parts of the SiGe layer are selectively etched to the gate oxide and the gate electrode layer to form underetched recesses beneath the gate electrode layer within the SiGe layer on both sides of the wordline stacks. An oxide layer is formed on surfaces of the semiconductor body, of remaining parts of the SiGe layer, and of the gate electrode layer and a material that is provided for a charge-trapping memory layer is deposited. The material, except for residual parts that form striplike memory layers beneath lower edges of the gate electrode layer, are then removed.

These and other features and advantages of the invention will become apparent from the following brief description of the drawings, detailed description and appended claims and drawings.

BRIEF DESCRIPTION OF THE DRAWINGS

Embodiments and examples of the invention are further described in detail in conjunction with the accompanying drawings, in which.

The following list of reference symbols can be used in conjunction with the FIGS.

| | |
|---|---|
| 1 | shallow trench isolation |
| 2 | local interconnect |
| 3 | semiconductor body |
| 4 | gate oxide |
| 5 | gate electrode layer |
| 6 | wordline layer |
| 7 | hardmask layer |
| 8 | etched openings |
| 9 | gap filling |
| 10 | source/drain region |
| 11 | re-oxidation layer |
| 12 | memory layer |
| 13 | cap layer |
| 14 | first spacer |
| 15 | second spacer |
| 16 | gap filling residues |
| 17 | insulating layer |
| 18 | interstice |
| 19 | sidewall spacer |
| 20 | source/drain region |
| 21 | LDD region |
| 22 | basic dielectric |
| 23 | bitline |
| 24 | bitline contact |
| 25 | drain contact via |
| 26 | gate electrode |
| 27 | gate contact via |
| 28 | memory cell array |
| 29 | peripheral area |
| 30 | SiGe layer |

DETAILED DESCRIPTION OF ILLUSTRATIVE EMBODIMENTS

Figure 1:
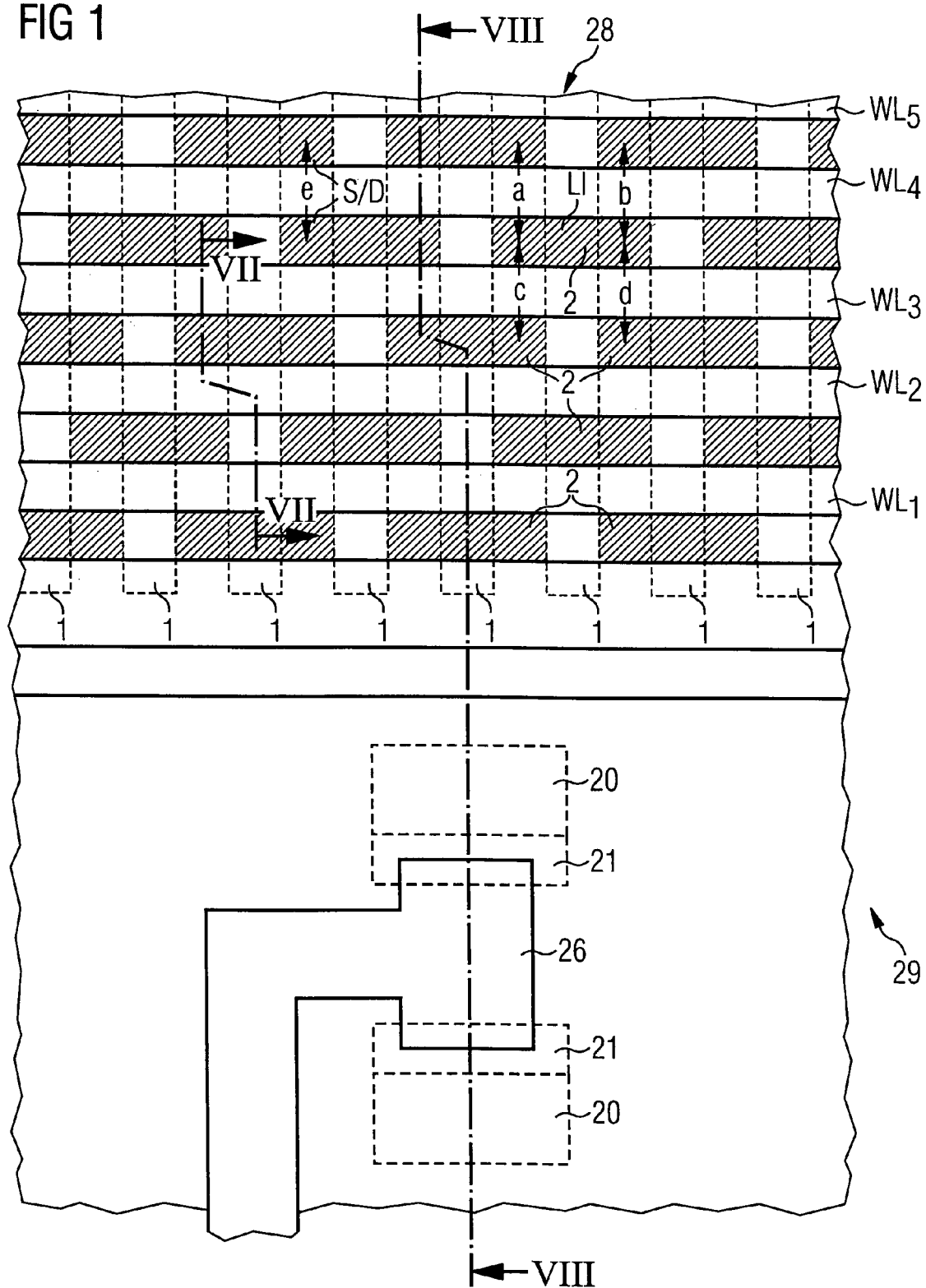
FIG. 1 shows a plan view of a memory cell array with periphery.

FIG. 1 shows the plane view onto a section of the surface of an intermediate product of a memory device fabricated according to a preferred embodiment of the inventive method. The wordlines $WL_n$ are represented running in parallel from left to right across the area of the memory cell array 28. This area comprises shallow trench isolations 1 within the semiconductor material of the substrate or semiconductor body, which are spaced apart and arranged parallel to one another, as indicated by broken lines, and run orthogonally across the wordlines. The bitlines are arranged above the areas of the shallow trench isolations 1 and are not shown here. Between the shallow trench isolations, there are the active areas comprising the memory cell transistor structures.

A preferred embodiment to be fabricated by the inventive method comprises electrically conductive local interconnects 2 arranged within the hatched areas of FIG. 1. Each of the local interconnects 2 bridges a shallow trench isolation 1 and connects source/drain regions of four adjacent memory cells that are arranged in a square. The channel region of the transistor structure of a memory cell is located under the appertaining wordline between the source/drain regions situated under the end parts of the local interconnects. The positions of the source/drain regions of a memory cell are shown in the example of memory cell e of FIG. 1, where the source/drain regions are designated by S/D.

If the memory cells are enumerated along the wordlines by a continuous enumeration, the local interconnects connect the source/drain regions of the odd-numbered memory cells on one side of the respective wordline to the source/drain regions of the subsequent even-numbered memory cell. On the other side of the same wordline, the local interconnects connect the source/drain regions of the even-numbered memory cells to the subsequent odd-numbered memory cell, according to this continuous enumeration. As the local interconnects 2 pertain to memory cells in both adjacent wordlines, the local interconnects connect source/drain regions of a total of four memory cells, which are arranged in a square quadruple. The memory cells located at a, b, c, and d in FIG. 1, for example, are connected by the local interconnect LI designated in FIG. 1 so that each of these four memory cells comprises a source/drain region that is connected to a source/drain region of the other three memory cells of this quadruple.

The memory device further comprises an addressing periphery, where CMOS devices are arranged to form an electric circuitry provided as logic circuit to address the memory cells in read, write and erase operations. The complementary transistors of these electronic circuits are produced according to standard technology, but the producing steps are incorporated in the inventive method, which allows the fabrication of a charge-trapping memory cell array of extremely small dimensions with integrated CMOS addressing circuitry. FIG. 1 shows, by way of example, a transistor structure comprising a gate electrode 26 provided to control the channel region between source/drain regions 20 that comprise LDD (lightly doped drain) regions 21. The area of the memory cell array 28 is typically separated from the peripheral area 29 comprising the CMOS devices, which are processed according to the standard technology comprising the arrangement of p-wells and n-wells within the semiconductor substrate provided for complementary transistors.

Figure 2:
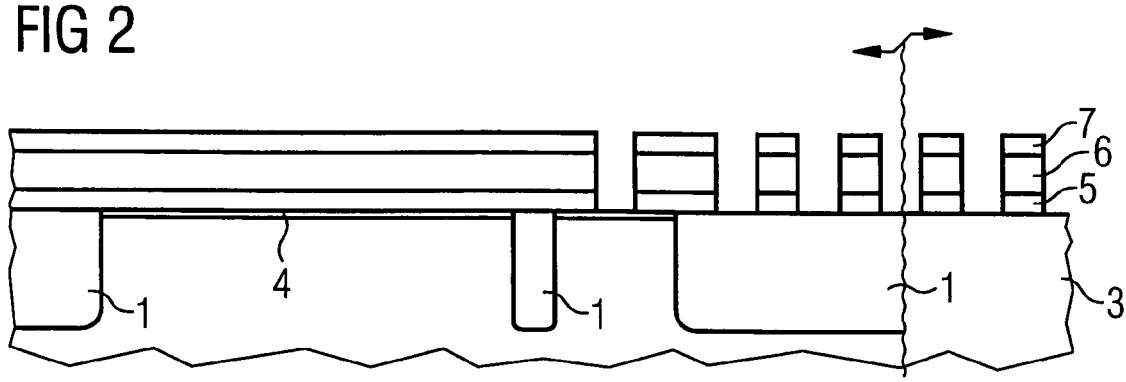
FIG. 2 shows a cross-section of a first intermediate product of a preferred example of the inventive method.
Figure 8:
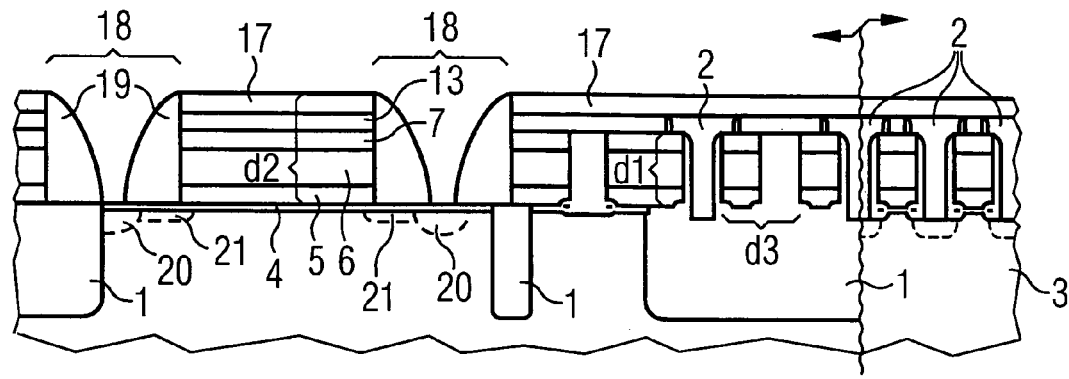
FIG. 8 shows the cross-section according to FIG. 6 for a fifth intermediate product after further process steps.

FIG. 2 shows the cross-section of an intermediate product along the broken line inserted in FIG. 1 bearing reference to FIG. 8. On the right hand side, this cross-section shows the area of a memory cell array in two different planes of reference. To the left of the waved line, the cross-section through the area of the shallow trench isolation 1 is shown, while on the right side of the waved line, the section across the active area is shown. The shallow trench isolations 1 are produced in standard fashion by etching trenches into the semiconductor material and filling these trenches afterwards with dielectric material, preferably oxide. A gate oxide 4 is applied to an upper surface of a semiconductor body 3. The gate oxide 4 can be adapted in thickness and material to the different transistor types to be manufactured. Wells can be implanted and annealed according to the different types of transistors in different regions of the semiconductor body.

Then a layer sequence provided for the wordline stacks is applied on the upper surface of the semiconductor body. This layer sequence preferably comprises a gate electrode layer 5, preferably of polysilicon, a wordline layer 6 that is intended to reduce the electric track resistance of the wordline and is preferably made of metal or metal silicide, and a hardmask layer 7, which is preferably nitride. By a subsequent photolithography and etching step, this gate electrode layer 5, this wordline layer 6 and this hardmask layer 7 are structured to form parallel wordline stacks in the area provided for the memory cell array 28. In order to be comprehensive, FIG. 2 shows an intermediate stack, the lateral dimension of which differs from the fixed pitch of the breadth of the wordlines and the interspaces between the wordlines and which is located in a transitional area between the area of the memory cell array 28 and the CMOS peripheral area 29 as a result of boundary effects occurring in the lithography step.

Figure 3:
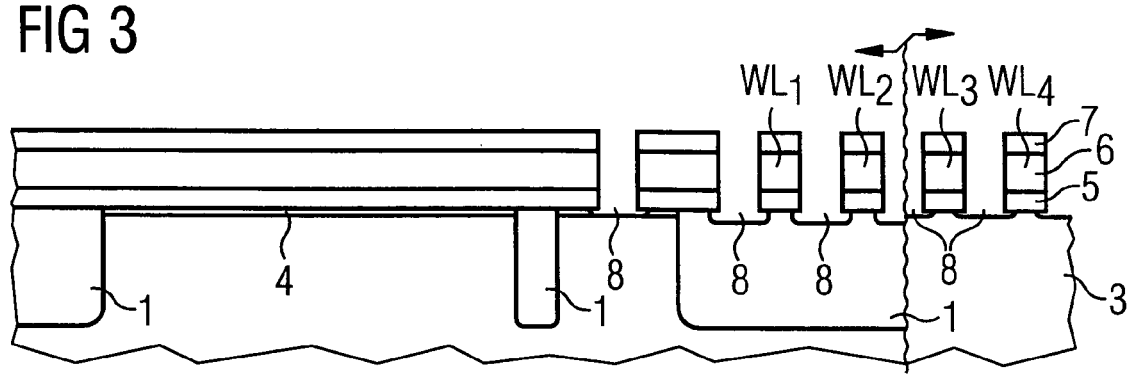
FIG. 3 shows the cross-section according to FIG. 2 of a second intermediate product after further process steps.

FIG. 3 shows the cross-section according to FIG. 2 after a wet etching process step to form the etched openings 8 in the gate oxide 4 and the shallow trench isolations 1 within the area of the memory cell array 28. As can be seen from FIG. 3, the oxide material of the shallow trench isolations 1 is etched typically about 20 to 30 nm deep, i.e., somewhat deeper than the gate oxide 4. The etched openings 8 form undercut openings between the gate electrode layer 5 and the semiconductor body 3 at lower lateral edges of the gate electrode layer 5. FIG. 3 also shows the wordline stacks of wordlines $WL_1$, $WL_2$, $WL_3$, and $WL_4$ to be compared with the plane view of FIG. 1.

Figure 4:
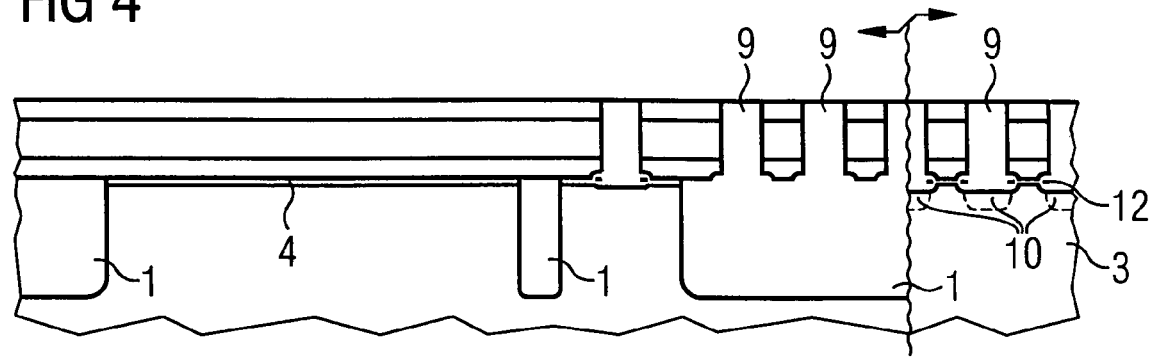
FIG. 4 shows the cross-section according to FIG. 3 for a third intermediate product after further process steps.

FIG. 4 shows the cross-section according to FIG. 3 after further process steps, by which the memory layer sequence, especially a charge-trapping layer sequence, is fabricated. The preferred example of the inventive method is further described for the preferred embodiment comprising an ONO memory layer sequence, although any material sequence which is appropriate for charge-trapping memory cells can be applied as well.

A lower confinement layer is prepared, which is an oxide layer in the case of an oxide-nitride-oxide charge-trapping layer sequence. The lower confinement layer can be produced by a combination of a thermal oxidation of the semiconductor material and the deposition of a high-temperature oxide to a thickness of typically about 4 nm. The deposition of an LPCVD (low pressure chemical vapor deposition) nitride layer of a thickness of about 4 nm follows, by which the memory layer, the actual site of the charge storage, is produced in the undercut openings between the gate electrode layer and the semiconductor material. Then the source/drain regions are formed by an implantation of doping atoms, for example boron or arsenic. After an anneal of the source/drain implant, the deposited nitride is wet etched so that the memory layer remains in the provided dimensions.

The described process steps, which make use of the undercut openings, create a memory layer comprising striplike parts that are only a few nanometers wide and especially adapted to multi-bit memory cells of small dimensions and extremely short channels, because they provide a sufficient electric separation between the sites of the stored bits. Nonetheless, as mentioned above, it is also possible to have a charge-trapping layer which is formed in a standard fashion and is not interrupted above the middle section of the channel.

FIG. 4 shows the location of the source/drain regions 10 and the memory layer 12. In every wordline stack of this embodiment, the memory layer 12 is composed of two strips running along the lower edges of the gate electrode layer 5. The surface of the structure is re-oxidized to form thin oxide layers on the sidewalls of the wordline stacks. The gaps between the wordline stacks are filled by deposition of a gap filling 9, preferably an oxide, which is subsequently planarized, for example by CMP (chemical mechanical polishing). Upon the plain surface formed by the hardmask layer 7 and the planar gap fillings 9, a cap layer is deposited, which is preferably silicon nitride.

Figure 5:
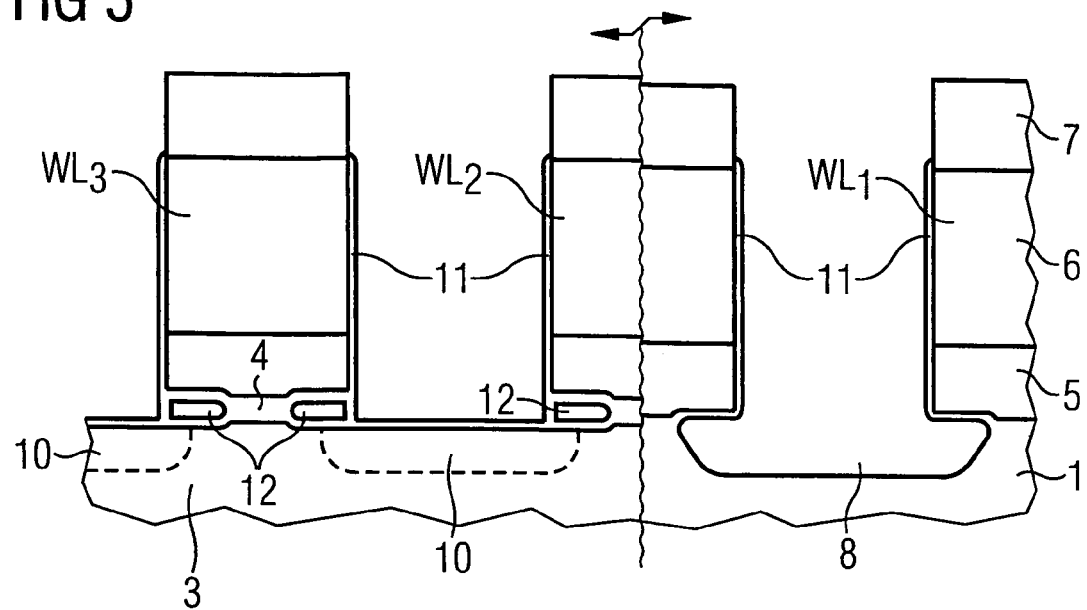
FIG. 5 shows an enlarged cross-section of the third intermediate product according to FIG. 4.
Figure 7:
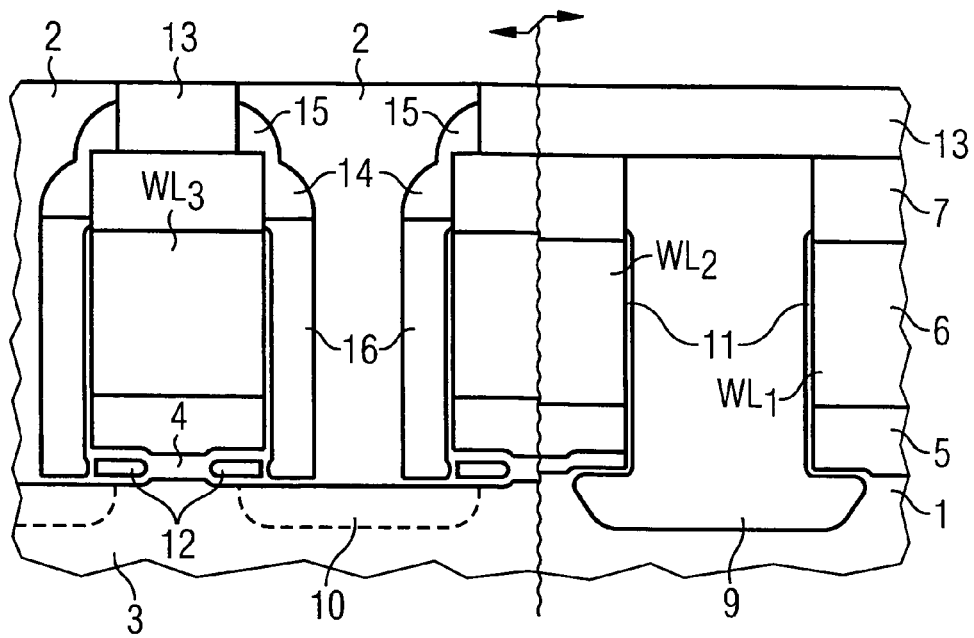
FIG. 7 shows an enlarged cross-section of the fourth intermediate product according to FIG. 6.

FIG. 5 shows an enlarged cross-section of the intermediate product according to FIG. 4 along the broken line inserted in FIG. 1, bearing reference to FIG. 7, encompassing the area of the sequence of the wordline stacks of the first three wordlines $WL_1$, $WL_2$, and $WL_3$. The boundaries of the implanted source/drain regions 10 are shown by broken lines designating the PN-junctions. The cross-sections of the striplike parts of the memory layer 12 are shown between the lower edges of the gate electrode layer 5 and the semiconductor body 3. The memory layer 12, which is, for instance, nitride, is embedded in dielectric material that is oxide material in the case of an ONO memory layer sequence and can be part of the gate oxide 4. The sidewalls of the wordline stacks are covered by re-oxidation layers 11. The region between the active regions is shown on the right side of FIG. 5, where the etched openings 8 appear in the area of the shallow trench isolation 1. The gaps between the wordlines are filled with gap filling of a dielectric material, preferably silicon oxide, as described above.

Figure 6:
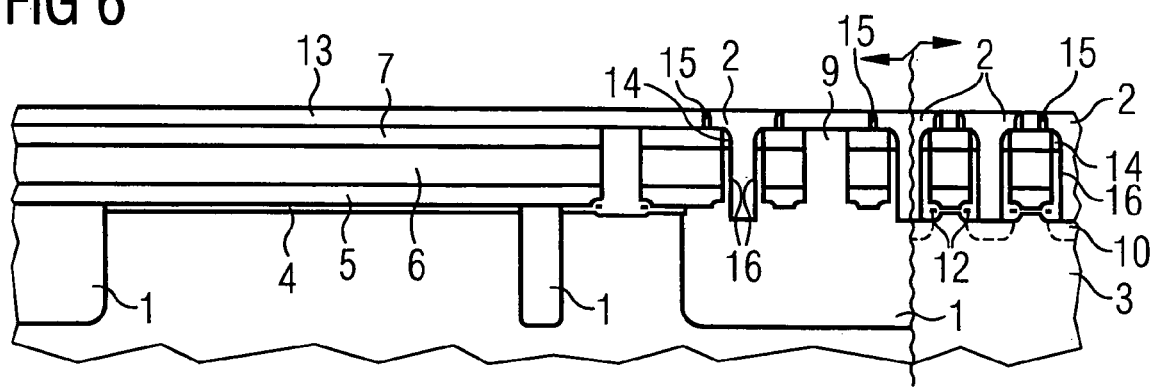
FIG. 6 shows the cross-section according to FIG. 4 for a fourth intermediate product after further process steps.

FIG. 6 shows a cross-section according to FIG. 4 after the formation of source/drain contacts. After the planarization step, the cap layer 13, preferably of nitride, is deposited and structured by a subsequent photolithography step. In this step, the cap layer 13 is removed in the areas provided for the source/drain contacts. If the cap layer 13 is nitride and the gap filling 9 is oxide, the cap layer 13 is preferably structured by reactive ion etching. The etching process is stopped when the oxide of the gap filling 9 is reached. After this, recesses are etched into the material of the gap filling 9. The depth of these recesses may at least approximately correspond to the thickness of the hardmask layer 7. Then the material, which is provided for the formation of sidewall spacers, is deposited. This material can preferably be nitride, which is removed by reactive ion etching to form typically 30 nm wide first spacers 14 in the recesses at the level of the hardmask layer 7 and second spacers 15 on sidewalls of the openings in the cap layer 13.

The first spacers 14 are relevant for a subsequent anisotropic etching process, by which the gap filling 9 is removed down to the surface of semiconductor material in the area of the source/drain regions. As the etching process is anisotropic, the first spacers 14 mask the material of the gap fillings 9 on the sidewalls of the wordline stacks so that gap filling residues 16 are left on these sidewalls, forming sidewall insulations of the wordlines. This important stage of the inventive method provides sidewall insulations of the wordlines that can be formed of oxide instead of the usually applied nitride, as shown by the described example. Then an electrically conductive material such as polysilicon can be applied to form the local interconnects 2, which are provided as source/drain contacts and electric connections between the source/drain regions and the bitlines.

There are different possibilities to structure the local interconnects 2 according to the required dimensions along the wordlines. The etching of the gap filling 9 can be performed using a mask that covers periodically spaced regions of the gaps between the wordline stacks so that the material of the gap filling 9 remains in these regions as electric insulation between the etched holes, which are filled with the electrically conductive material provided for the local interconnects. However, a preferable process step sequence to structure the local interconnects 2 comprises the etching of the gap filling 9 to form continuous trenches between the gap filling residues 16 in the opened gaps between the wordline stacks, which are filled with the electrically conductive material provided for the local interconnects. This material is then structured according to the required longitudinal dimensions of the local interconnects by means of a mask and a further etching process, and the interspaces between the structured interconnects are filled again with dielectric material, preferably with oxide. The material of the local interconnects is planarized.

FIG. 7 shows an enlarged cross-section according to FIG. 5 of the intermediate product according to FIG. 6. In this cross-section, the gap filling 9, the re-oxidation layer 11, the arrangement of the memory layer 12, the structured cap layer 13, the first spacers 14, the second spacers 15, and the gap filling residues 16 are represented in detail. The first spacers 14, which have served to structure the gap filling 9 into the gap filling residues 16, are not necessarily separated from the second spacers 15, as shown in FIG. 6, but may be only slightly detached from them. This feature may vary according to the embodiment. It is merely important to have first spacers 14 to mask the marginal parts of the gap filling 9 so that they are not etched away, but form the sidewall insulation of the wordline stacks.

FIG. 8 shows the cross-section according to FIG. 6 after further process steps performed to structure the CMOS devices. After the application of an upper insulating layer 17, which may be deposited as plasma enhanced nitride covered with an anti-reflective coating to aid the subsequent photolithography, the CMOS devices are structured by etching interstices 18 in the peripheral area. This structuring defines the gate electrodes that form part of the gate electrode layer 5. This is shown on the left side of FIG. 8. After a standard re-oxidation step, doping atoms are implanted to form LDD (lightly doped drain) regions 21. After the deposition of a nitride liner, wide sidewall spacers, especially oxide spacers 19, are formed at the sidewalls of the gate electrode stacks. These sidewall spacers 19 have a typical width of about 150 nm. The sidewall spacers 19 are then used as masks for source/drain implantations to form source/drain regions 20 of the CMOS devices. The LDD regions 21 are covered by the sidewall spacers 19 during this implantation.

The interstices 18 between the CMOS devices are considerably larger than the small gaps between the wordline stacks. By the inventive method, it is possible to produce both the transistor structures in the memory cell array having typical dimensions of down to 70 nm and the CMOS device structures having typical lateral dimensions that necessitate the application of wider sidewall spacers 19. As the height, i.e., the vertical dimension with respect to the substrate, of the gate stacks in the peripheral area 29 is larger than the height of the wordline stacks, the interstices 18 have to be comparatively broader than the gaps between the wordline stacks in the memory cell area 28. In the preferred embodiments of the inventive structure, the vertical dimension d1 of the wordline stack comprising the gate electrode layer 5, the wordline layer 6 and the hardmask layer 7 is at most 200 nm, while the vertical dimension d2 of the gate stacks comprising the aforementioned layers plus the cap layer 13 and the insulating layer 17 is at least 250 nm. The lateral pitch d3 of the memory cell array, measured across the wordline stacks as a distance between corresponding spots of adjacent wordline stacks, can be chosen to be at most 250 nm. Therefore, the inventive method provides a sequence of processing steps that is suitable to manufacture the CMOS devices of the circuitry in the peripheral area with the appropriate dimensions after the memory cell array has completely been structured in essentially smaller dimensions. In this manner, the appropriate lateral and vertical dimensions can be chosen according to the types of transistor devices. The described layer sequence and sequence of process steps is especially adapted to the production of completely integrated memory devices.

Figure 9:
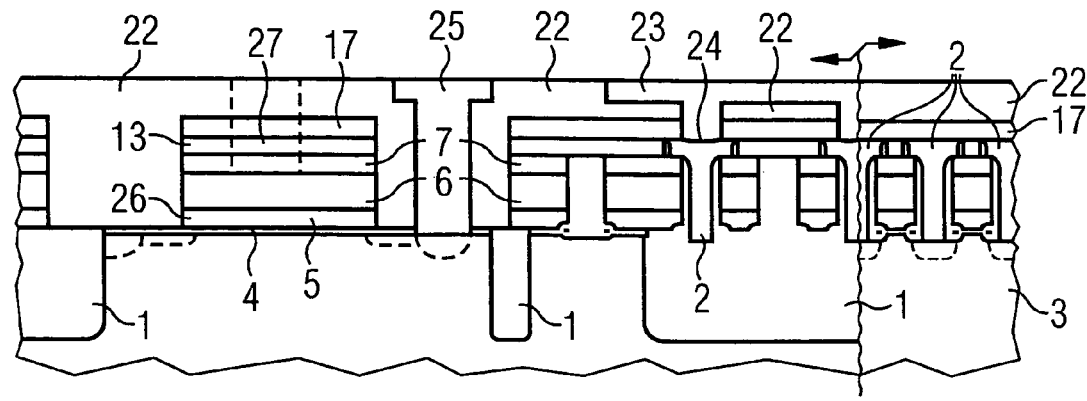
FIG. 9 shows the cross-section according to FIG. 8 for a sixth intermediate product after further process steps.

FIG. 9 shows the cross-section of FIG. 8 after the application of source/drain contacts in the peripheral area 29. After an anneal of the junction implants, the sidewall spacers 19 have been removed, for instance by wet etching. The interstices 18 are then filled with dielectric material, which may comprise deposited oxide and nitride layers according to standard technology and a main gap filling of BPSG (boron phosphorous silicate glass). Especially in the area of the memory cell array 28, this filling forms a basic dielectric 22 for the metallization levels of a wiring. FIG. 9 shows a bitline 23 with bitline contact 24 on the local interconnect 2 adjacent the first wordline $WL_1$. The bitline 23 and the bitline contact 24 can be produced by the process known by the name of dual damascene. Contact holes, subsequently filled with electrically conductive material, serve to produce drain contact vias 25 on the source/drain regions of the CMOS devices to be connected. The gate electrode 26 of the CMOS device can also be contacted by means of a gate contact via 27. As the gate electrode 26 can also be electrically connected by an appropriately structured part of the gate electrode layer 5, for example as shown in FIG. 1, the gate contact via 27 is indicated with a broken line in FIG. 9. Further metal wiring layers and intermetal oxides are applied in the usual fashion and are not shown in FIG. 9. This memory device is then further processed in standard finishing process steps including passivation and housing. This is not described in detail as it is not constituent of the inventive method.

A preferred embodiment of the memory cell array of charge-trapping memory cells comprises an improved gate structure having an SiGe layer. This structure is further described in detail by way of preferred production methods as shown in the cross-sections of the FIGS. 10 to 13.

Figure 10:
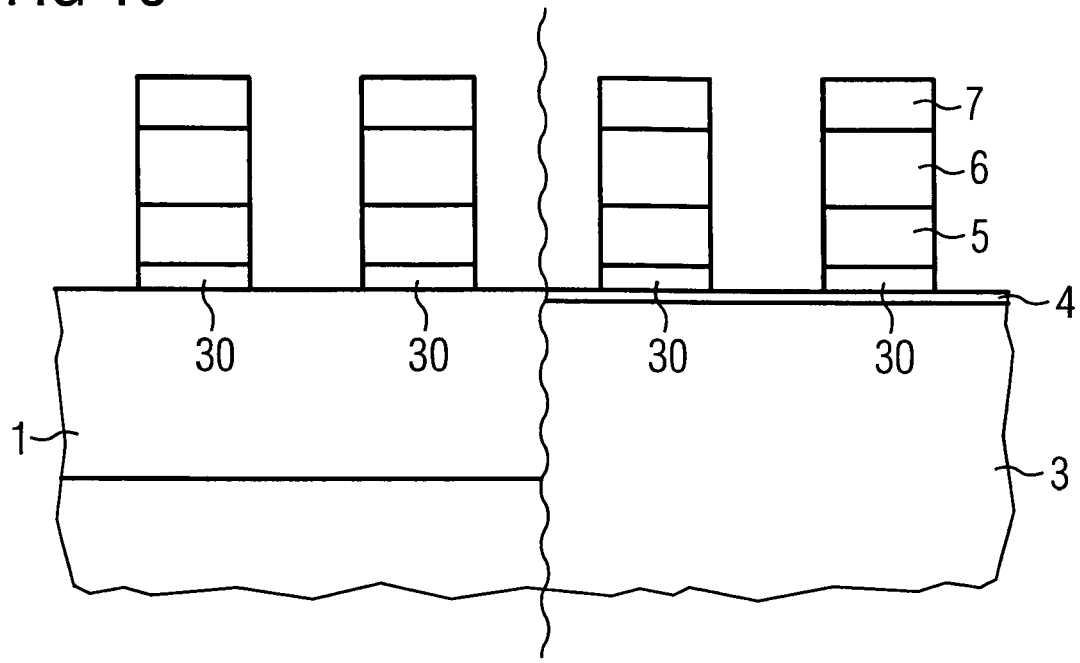
FIG. 10 shows a cross-section according to the right side of FIG. 2 for an embodiment comprising an SiGe layer.

The cross-section of FIG. 10 shows a semiconductor body 3, which is provided with shallow trench isolations 1 to separate columns of memory cells. The surface of the semiconductor body 3 in the area of the memory cell array is covered with a gate oxide 4, which is preferably grown thermally, typically about 4 nm thick. An SiGe layer 30 is applied, which is followed by the deposition of the gate electrode layer 5, preferably of polysilicon, the wordline layer 6 of a metal and/or a metal silicide, for example comprising tungsten, and the hardmask layer 7. The SiGe layer is preferably 10 nm to 15 nm thick and contains preferably between 20 atom-percent and 70 atom-percent germanium. The wordline stacks are structured, including the SiGe layer 30, which forms part of the wordline stacks. Then, the SiGe layer 30 is etched back isotropically and selectively to the material of the gate electrode layer 5 and the gate oxide 4.

If the gate electrode layer 5 is polysilicon and the gate oxide is $SiO_2$, the etching step may be performed, for example, by one of the following variants. A first variant uses a polysilicon etchant, which is composed of 70%-$HNO_3$, 49%-HF, 99.9%-$CH_3COOH$ and $H_2O$. The ratio of the composition is, for example, 40:1:2:57 in relative atomic masses. This mixture is preferably dissolved in water in a typical ratio of between 10:1 and 10:5 (see, for example, S. M. Kim, et al. in IEEE Transactions on Nanotechnology 2, p. 253 (2003), which is incorporated herein by reference). A second variant uses 30%-$H_2O_2$ at typically 90° C., which is especially appropriate if the germanium proportion is high, typically more than 60% (see, for example, A. Franke, et al., Journal of Microelectromechanical Systems 12, Apr. 2003, which is incorporated herein by reference). A third variant uses an etchant that is composed of 30%-$NH_4OH$, 30-$H_2O_2$ and $H_2O$ in a preferred ratio of 1:1:5 at typically 75° C. With this etchant, the following etch selectivities are obtained, according to F. Scott Johnson, et al. in Journal Electron. Materials 21, pp. 805–810 (1992), which is incorporated herein by reference: for SiGe containing 40 atom-percent germanium: ratio of etch rate of SiGe and etch rate of Si=36:1 and ratio of etch rate of SiGe and etch rate of $SiO_2$=100:1; SiGe containing 55 atom-percent germanium: ratio of etch rate of SiGe and etch rate of Si=177:1 and ratio of etch rate of SiGe and etch rate of $SiO_2$=487:1 As selectivities of more than 100:1 of SiGe to Si and $SiO_2$ can be achieved with these wet etching methods, an underetch of the oxide of the shallow trench isolations 1 can be avoided.

Figure 11:
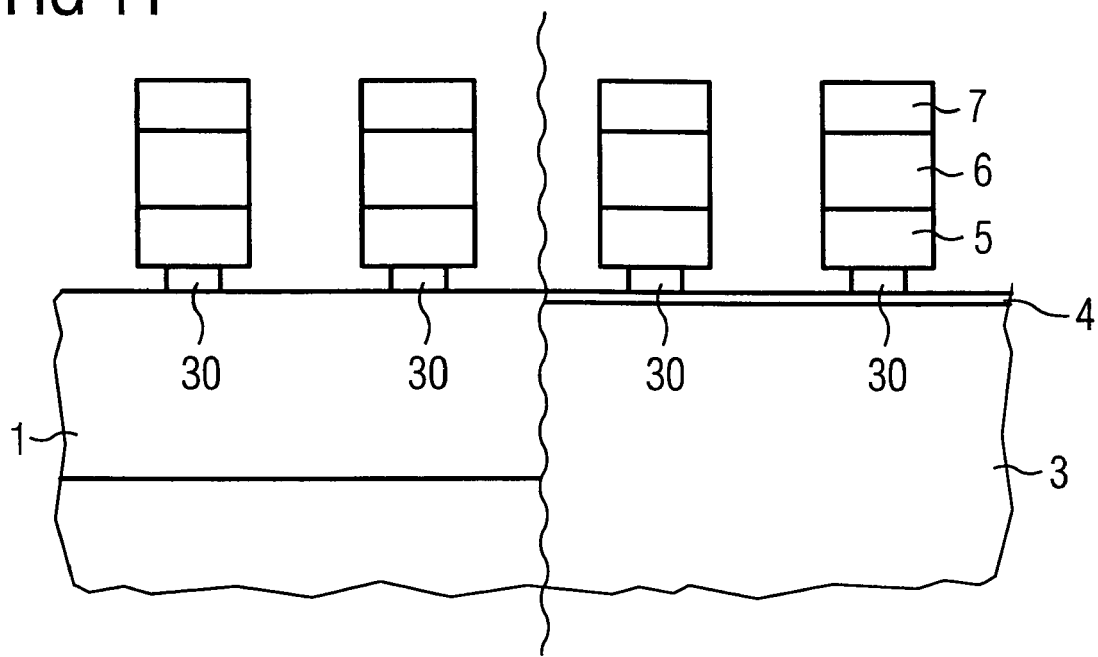
FIG. 11 shows the cross-section according to FIG. 10 after the etching of recesses in the SiGe layer.

The resulting intermediate product of this etching process of the SiGe layer 30 is shown in cross-section in FIG. 11. There are lateral recesses in the SiGe layer between the wordline stacks and the semiconductor body, and residual parts of the SiGe layer 30 are left between the gate electrode layer 5 and the gate oxide 4. The gate oxide 4 is then isotropically etched, for example by means of HF. Because of the perpendicular direction of the etch attack from above, almost no oxide of the shallow trench isolation 1 is removed; if necessary, a wetting agent can be added.

Figure 12:
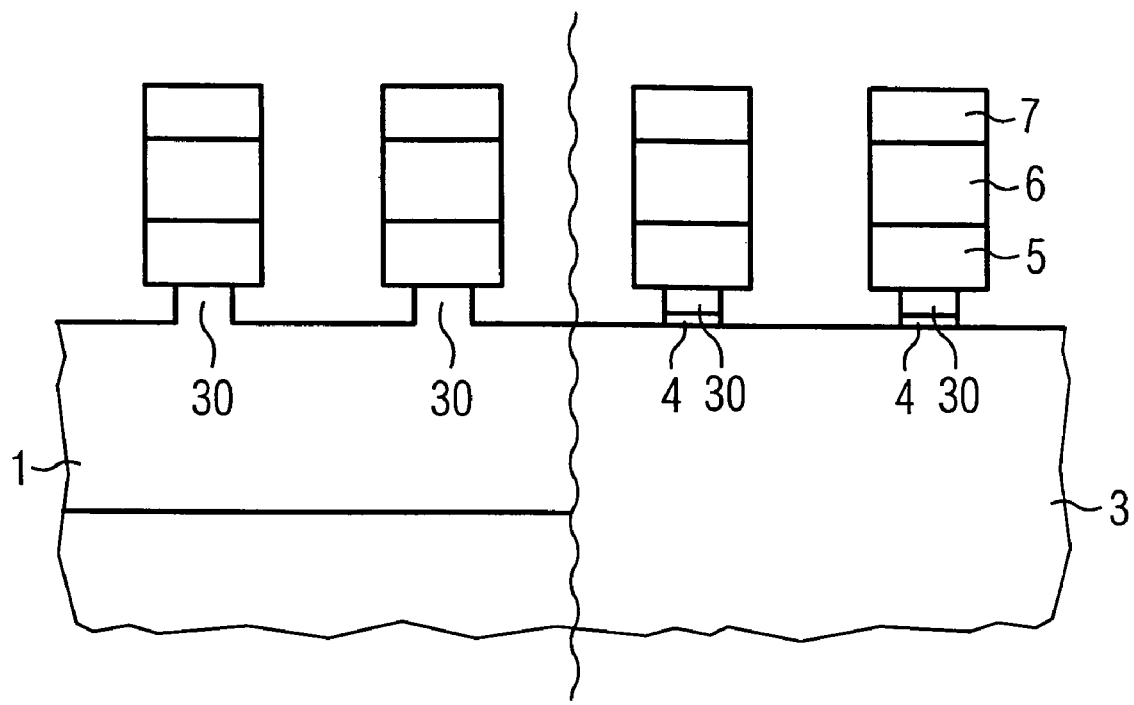
FIG. 12 shows the cross-section according to FIG. 11 after the etching of the gate oxide.

FIG. 12 shows the next intermediate product after the removal of the gate oxide except for the remaining parts underneath the residual parts of the SiGe layer 30. Then, another dielectric material, preferably thermally grown $SiO_2$, is produced on the free surfaces of the semiconductor material, the SiGe layer, and the gate electrode layer 5.

Figure 13:
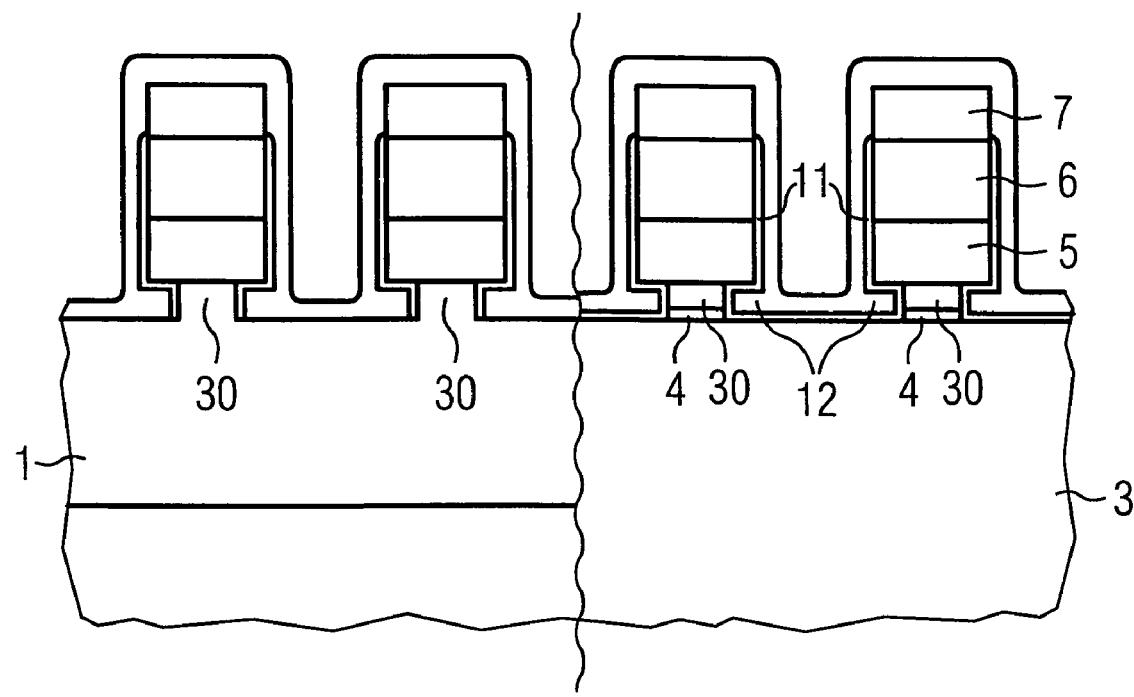
FIG. 13 shows the cross-section according to FIG. 12 after the application of the material provided for the memory layer.

This re-oxidation layer 11 is shown in the cross-section of FIG. 13, which also shows the subsequent application of a layer of the material which is intended for the memory layer 12. This is preferably $Si_3N_4$, which can be applied conformally by low-pressure chemical vapor deposition. The lateral recesses that are provided for the memory layer 12 have slightly reduced dimensions due to the production of the re-oxidation layer 11. The layer of the material that is intended for the memory layer 12 is preferably deposited at least half as thick as the dimension of the recesses. In the case of the above-mentioned typical dimensions, this layer is preferably about 5 nm thick. In this way, the recesses are completely filled with the material so that the memory layer 12 can be formed as an integral nanostrip. The thicknesses of the layers are not drawn to scale. The re-oxidation layer 11 is typically about 4 nm thick on the lateral surfaces of the SiGe layer, but, in this example, grows typically about 6 nm thick on the sidewalls of the wordline stack. This is due to the high doping of the polysilicon of the gate electrode layer 5.

The layer comprising the memory layer material is then etched back isotropically so that residual parts are left, which form the memory layer 12. Since the shallow trench isolation has not been underetched, the memory layer 12 is obtained as a thin continuous strip having a width in the nanometer range. Subsequently, the doping of the source/drain regions can be implanted, and sidewall spacers 16 according to the embodiments already described can be formed by the usual conformal deposition and anisotropic etching.

Although the present invention and its advantages have been described in detail, it should be understood that various changes, substitutions and alterations can be made herein without departing from the spirit and scope of the invention as defined by the appended claims.

What is claimed is:

1. A method for fabricating semiconductor memory devices, the method comprising:

forming a gate oxide on a surface of a semiconductor body:

forming shallow trench isolations at said surface, said shallow trench isolations providing electrically insulating strips spaced apart and arranged parallel to one another in a region provided for a memory cell array;

depositing an SiGe layer on said gate oxide subsequent to forming said shallow trench isolations;

depositing a gate electrode layer and a wordline layer on said SiGe layer;

applying a hardmask layer on said wordline layer;

structuring said wordline, said gate electrode layer, and said SiGe layer to form wordline stacks subsequent to said step of applying said hardmask layer, and further structuring said wordline stacks to run transversely to said shallow trench isolations in said region provided for said memory cell array;

etching residual parts of said SiGe layer selectively to said gate oxide and said gate electrode to form underetched recesses beneath said gate electrode layer within said SiGe layer on both sides of said wordline stacks;

etching away said gate oxide between said wordline stacks after the etching of said SiGe layer;

forming an oxide layer on surfaces of the semiconductor body of remaining parts of said SiGe layer, and of said gate electrode layer;

depositing a material for a memory layer;

removing said material except for residual parts that form strip like memory layers beneath lower edges of said gate electrode layer;

implanting dopant to form source/drain regions in said semiconductor body after the formation of said memory layer;

depositing a gap filling between said wordline stacks and planarizing said gap filling to an upper surface level of said hardmask layer;

applying a cap layer;

removing said cap layer and an upper partial layer of said gap filling in an area provided for contact holes to form recesses within said gap filling;

forming spacers on sidewalls of said recesses;

further removing said gap filling to form contact holes, thereby leaving gap filling residues on sidewalls of said wordline stacks beneath said spacers;

forming local interconnects of an electrically conductive material within said contact holes, said local interconnects being provided for an electric connection of said source/drain regions to bitlines;

applying an upper insulating layer;

structuring said insulating layer, said cap layer, said hardmask layer, said wordline layer, and said gate electrode layer in a peripheral area to residual stacks to form gate electrodes or gate electrodes and conductor tracks;

applying sidewall spacers to said residual stacks;

implanting a dopant to form source/drain regions provided for CMOS devices;

removing said sidewall spacers;

applying a dielectric material to fill free spaces between said stacks and to form a basic dielectric provided for the application of a wiring;

forming contact holes to said source/drain regions of said CMOS devices and/or to said gate electrodes of said CMOS devices as well as bitline openings and further contact holes to said local interconnects;

applying a first metallization to form contact vias in said contact holes and bitlines in said bitline openings, said bitlines contacting said local interconnects by contact visa in said further contact holes; and applying intermetal dielectric and further metallizations to form said wiring.

2. The method for fabricating semiconductor memory devices according to claim 1, wherein:

said local interconnects are arranged between said wordline stacks in such a fashion that in a first quadruple of memory cells comprising a first memory cell, a second memory cell that is adjacent said first memory cell in a direction of the wordlines, and a third memory cell and a fourth memory cell that are adjacent said first and second memory cells, respectively, in a direction of the bitlines, and further comprising a first source/drain region of said first memory cell, a first source/drain region of said second memory cell, a first source/drain region of said third memory cell, and a first source/drain region of said fourth memory cell, said first source/drain regions are electrically connected by a first one of said local interconnects and, said memory cells of said first quadruple forming first memory cells of a second, third, fourth, and fifth quadruple of memory cells arranged like the first quadruple, a second source/drain region of each of said memory cells of the first quadruple is electrically connected to first source/drain regions of a second, third, and fourth memory cell of the respective second, third, fourth or fifth quadruple of memory cells by a second, third, fourth, and fifth one, respectively, of said local interconnects.

3. A method of fabricating a semiconductor memory device, the method comprising:

forming a plurality of wordline stacks over a semiconductor body, each wordline stack; including an SiGe layer, a conductive material overlying the SiGe layer and a hardmask overlying the conductive material;

forming an undercut region beneath the wordline stack by selectively etching the SiGe layer relative to the conductive material;

applying a memory layer sequence between the wordline stacks in the undercut region;

forming source/drain regions in the semiconductor body between the wordline stacks;

forming a gap filling between the wordline stacks to an upper surface level of the hardmask;

applying a cap layer over the gap filling and the hardmask;

removing the cap layer and an upper portion of the gap filling in an area provided for contact holes thereby farming recesses within the gap filling;

forming spacers on sidewalk of the recesses;

further removing the gap filling to form contact holes, thereby leaving gap filling residues on sidewalls of the wordline stacks beneath the spacers; and forming an electrically conductive material within the contact holes.

4. The method of claim 3, wherein the memoxy layer sequence is applied as a charge-trapping memory layer of dielectric material embedded in dielectric confinement material.

5. The method of claim 3 and further comprising forming a plurality of CMOS peripheral transistors in the semiconductor body.

6. The method of claim 5 wherein foxniing a plurality of wordline stacks comprises:

forming a gate oxide over a surface of the semiconductor body; forming a gate electrode layer, a wordline layer, and a hardmask layer over the gate oxide; and structuring the gate electrode layer, the wordline layer, and the hardmask layer so as to form the wordline stacks.

7. The method of claim 6 and further comprising forming Thallow trench isolations at a surface of the semiconductor body, the shallow trench isolations providing electrically insulating strips spaced apart and arranged parallel to one another in a region provided for a memory cell array.

8. The method of claim 7 wherein the wordline stacks are structured so as to be spaced apart and arranged parallel to one another and running across the shallow trench isolations in a region provided for the memory cell array, thereby delimiting a location of a memory layer between the gate electrode layer and a channel region of the memory cells.

9. The method of claim 6 and further comprising:

forming an upper insulating layer over the wordline stack, the gap filling, and the electrically conductive material;

patterning the insulating layer, the cap layer, the hardmask layer, the wordline layer, and the gate electrode layer in the peripheral area to residual stacks to form gate electrodes or gate electrodes and conductor tracks;

applying sidewall spacers to the residual stacks;

implanting a dopant to form source/drain regions provided for CMOS devices;

removing the sidewall spacers;

applying a dielectric material to fill free spaces between the stacks and to form a basic dielectric provided for the application of a wiring;

forming contact holes to the source/drain regions of the CMOS devices and/or to the gate electrodes of the CMOS devices as well as bitline openings and further contact holes to local interconnects;

applying a first metallization to form contact vias in the contact holes and bitlines in the bitline openings, the bitlines contacting the local interconnects by contact vias in thc further contact holes; and applying intermetal dielectric and further metallizations to form the wiring.

10. The method of claim 3 wherein the gap filling comprises an oxide material.

11. The method of claim 10 wherein the hardni ask layer and the cap layer comprise nitride layers.

12. The method of claim 3 wherein forming an electrically conductive material within the contact holes comprises forming local interconnects that provide for electrical connection between the source/drain regions and bitlines.

13. The method of claim 12 wherein the local interconnects are arranged between the wordline stacks in such a fashion that in a first quadruple of memory cells comprising a first memory cell, a second memory cell the is adjacent the first memory cell in a direction of the wordlines, and a third memory cell and a fourth memory cell tat are adjacent the first and second memory cells, respectively, in a direction of the bitlines, and further comprising a first source/drain region of the first memory cell, a first source/drain region of the second memory cell, a first source/drain region of the third memory cell, and a first source/drain region of the fourth memory cell,
   the first source/drain regions are electrically connected by a first one of the local interconnects and,
   the memory cells of the first quadruple forming first memory cells of a second, third, fourth, and fifth quadruple of memory cells arranged like the first quadruple,
   a second source/drain region of each of the memory cells of the first quadruple is electrically connected to first source/drain regions of a second, third, and fourth memory cell of the respective second, third, fourth or fifth quadruple of memory cells by a second, third, fourth, and fifth one, respectively, of the local interconnects.

14. The method for fabricating a semiconductor memory device according to claim 6, wherein each of said wordline stacks is part of one memory cell in an array of memory cells arranged at the main surface, the memory device further comprising a peripheral area at the main surface of the semiconductor body, wherein CMOS circuitry is located in the peripheral area, the CMOS circuitry comprising CMOS devices to address the memory cell array in write, read, or erase operations, wherein:
   the memory cell array comprises wordline stacks encompassing the gate electrodes and having a first dimension in a direction perpendicular to the main surface of the semiconductor body;
   the CMOS devices comprise gate stacks having a second dimension in the direction perpendicular to the main surfrce of the semiconductor body;
   the first dimension of the wordline stacks is at most 200 nm;
   the second dimension of the gate stacks is at least 250 nm; and
   any difference between the first dimension and the second dimension is compensated by at least one further layer of dielectric material covering the wordline stacks.

15. The method for fabricating a semiconductor memory device according to claim 14, wherein a pitch of the wordline stacks, measured across the wordline stacks as a distance between corresponding spots of adjacent wordline stacks, is at most 250 nm.

16. The method for fabricating a semiconductor memory device according to claim 14, wherein the first dimension is different than the second dimension, the device further comprising at least one layer of dielectric material overlying the wordline stacks, the at least one layer of dielectric material having a thickness equal to the difference between the first dimension and the second dimension.

* * * * *

UNITED STATES PATENT AND TRADEMARK OFFICE
CERTIFICATE OF CORRECTION

PATENT NO. : 7,186,607 B2  
APPLICATION NO. : 11/061314  
DATED : March 6, 2007  
INVENTOR(S) : Seidl et al.

Page 1 of 1

It is certified that error appears in the above-identified patent and that said Letters Patent is hereby corrected as shown below:

Column 10, line 62; delete "bardmask" insert --hardmask--  
Column 12, line 10; delete "farming" insert--forming--  
Column 12, line 11; delete "sidewalk" insert --sidewalls--  
Column 12, line 17; delete "memoxy" insert--memory--  
Column 12, line 24; delete "foxniing" insert--forming--  
Column 12, line 33; delete "Thallow" insert--shallow--  
Column 13, line 3;  delete "hardni ask" insert--hardmask--  
Column 13, line 12; delete "cell the" insert--that--  
Column 13, line 14; delete "tat" insert--that--

Signed and Sealed this

Twenty-sixth Day of February, 2008

JON W. DUDAS  
*Director of the United States Patent and Trademark Office*